(12) United States Patent
Watanabe

(10) Patent No.: US 11,107,952 B2
(45) Date of Patent: Aug. 31, 2021

(54) GROUP III NITRIDE SEMICONDUCTOR LIGHT EMITTING ELEMENT AND METHOD OF MANUFACTURING THE SAME

(71) Applicant: DOWA Electronics Materials Co., Ltd., Tokyo (JP)

(72) Inventor: Yasuhiro Watanabe, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 16/497,564

(22) PCT Filed: Mar. 23, 2018

(86) PCT No.: PCT/JP2018/011845
§ 371 (c)(1),
(2) Date: Sep. 25, 2019

(87) PCT Pub. No.: WO2018/181044
PCT Pub. Date: Oct. 4, 2018

(65) Prior Publication Data
US 2020/0287087 A1    Sep. 10, 2020

(30) Foreign Application Priority Data
Mar. 27, 2017   (JP) .............................. JP2017-061733

(51) Int. Cl.
*H01L 33/32* (2010.01)
*H01L 33/00* (2010.01)
(Continued)

(52) U.S. Cl.
CPC .......... *H01L 33/325* (2013.01); *H01L 33/007* (2013.01); *H01L 33/06* (2013.01);
(Continued)

(58) Field of Classification Search
CPC ..................................................... H01L 33/325
(Continued)

(56) References Cited

U.S. PATENT DOCUMENTS

2009/0230422 A1* 9/2009 Katsuno .................. H01L 33/42
257/99
2014/0131732 A1   5/2014 Fu et al.
(Continued)

FOREIGN PATENT DOCUMENTS

JP    2012195321 A    10/2012
JP    2015216352 A    12/2015
(Continued)

OTHER PUBLICATIONS

Jun. 19, 2018, International Search Report issued in the International Patent Application No. PCT/JP2018/011845.
(Continued)

*Primary Examiner* — Hsin Yi Hsieh
(74) *Attorney, Agent, or Firm* — Kenja IP Law PC

(57) ABSTRACT

Provided are a group III nitride semiconductor light emitting element and a method of manufacturing the same. A group III nitride semiconductor light emitting element of the present disclosure comprises in this order, in a substrate, an n-type semiconductor layer, a light emitting layer, a p-type electron blocking layer, a p-type contact layer made of $Al_xGa_{1-x}N$, and a p-side reflection electrode, wherein a
(Continued)

center emission wavelength of light emitted from the light emitting layer is 270 nm or greater and 330 nm or smaller, the p-type contact layer is in contact with the p-side reflection electrode, and has a thickness of 20 nm or greater and 80 nm or smaller, and the Al composition ratio x of the p-type contact layer satisfies the following Formula:

$$2.09-0.006\times\lambda_p \leq x \leq 2.25-0.006\times\lambda_p$$

where $\lambda_p$ is the center emission wavelength in nanometer.

6 Claims, 5 Drawing Sheets

(51) Int. Cl.
  *H01L 33/06* (2010.01)
  *H01L 33/12* (2010.01)
  *H01L 33/14* (2010.01)
  *H01L 33/40* (2010.01)
(52) U.S. Cl.
  CPC ............ *H01L 33/12* (2013.01); *H01L 33/145* (2013.01); *H01L 33/405* (2013.01); *H01L 2933/0016* (2013.01)
(58) Field of Classification Search
  USPC ........................................................ 257/76
  See application file for complete search history.

(56) References Cited

U.S. PATENT DOCUMENTS

2015/0311392 A1* 10/2015 Hirayama ............... H01L 33/32
    257/13
2018/0331250 A1* 11/2018 Hirayama ........... H01L 33/0075

FOREIGN PATENT DOCUMENTS

JP      2016207754 A    12/2016
TW       201626600 A     7/2016

OTHER PUBLICATIONS

Oct. 1, 2019, International Preliminary Report on Patentability issued in the International Patent Application No. PCT/JP2018/011845.

Apr. 7, 2020, Notification of Reasons for Refusal issued by the Japan Patent Office in the corresponding Japanese Patent Application No. 2019-509730.

Apr. 27, 2021, Office Action issued by the Taiwan Intellectual Property Office in the corresponding Taiwanese Patent Application No. 107110482.

\* cited by examiner

FIG. 3
Step 3A
Step 3B
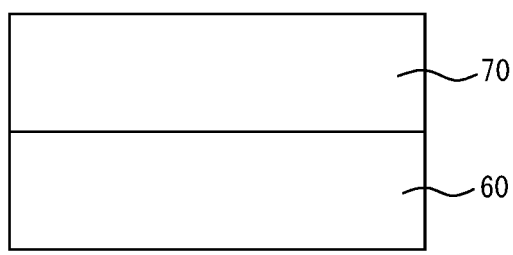
Step 3C
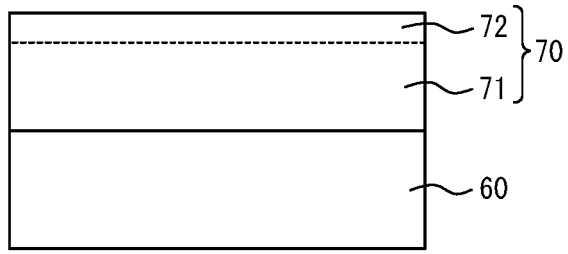
Step 3D

GROUP III NITRIDE SEMICONDUCTOR LIGHT EMITTING ELEMENT AND METHOD OF MANUFACTURING THE SAME

TECHNICAL FIELD

This disclosure relates to a group III nitride semiconductor light emitting element and a method of manufacturing the same. Particularly, it relates to a group III nitride semiconductor light emitting element that can maintain high light output power and has an improved reliability, and a method of manufacturing the same.

BACKGROUND

Group III nitride semiconductors made of a compound of N and group III elements (such as Al, Ga, and In), i.e., wide-bandgap semiconductors having direct gap band structures, have been expected as promising materials for a wide variety of applications, including sterilization, water purification, medicine, illumination, and high-density optical recording. Of these, light emitting elements having light emitting layers made of group III nitride semiconductors can be provided for wide wavelength ranges from deep ultraviolet light to visible light, by adjusting the composition ratios of the group III elements. Therefore, their applications to a wide variety of light sources have been sought.

Typical group III nitride semiconductor light emitting elements of deep ultraviolet light are fabricated by forming, in this order, an n-type semiconductor layer, a light emitting layer, and a p-type semiconductor layer on a substrate made of sapphire or single-crystalline AN, having a buffer layer interposed therebetween, and then forming an n-side electrode electrically coupled to the n-type semiconductor layer and a p-side electrode electrically coupled to the p-type semiconductor layer. In order to establish an ohmic contact, a p-type GaN contact layer is typically formed on the side of the p-side electrode of the p-type semiconductor layer. This is because the hole density can be easily increased in p-type GaN. For the light-emitting layer, a multiple quantum well (MQW) structure is typically used, in which a barrier layer and a well layer, each made of a group III nitride semiconductor, are alternately laminated.

Here, one of characteristics required for group III nitride semiconductor light emitting elements is a high external quantum efficiency characteristic. The external quantum efficiency is determined by: (i) the internal quantum efficiency, (ii) the electron influx efficiency, and (iii) the light extraction efficiency.

Patent Literature 1 (JP2015216352A) discloses an ultraviolet light-emitting diode comprising a p-type contact layer made of AlGaN mixed crystal and a reflection electrode that is reflective to radiated light from a light-emitting layer, of which light extraction direction is on the substrate side. JP2015216352A discusses that the transmittance of the p-type contact layer to short-wavelength light increases with an increase in the Al composition ratio of the p-type contact layer made of AlGaN. Accordingly, in place of p-type contact layers made of GaN that have been widely used, JP2015216352A proposes to use a p-type contact layer made of AlGaN, of which transmittance varies according to the emission wavelength. The teaching in JP2015216352A could be interpreted that, even if the p-type contact layer made of AlGaN reduces the hole density, an increased transmittance of a p-type contact layer to reflected light would significantly improve light extraction efficiency, which is expected to lead to an improvement in the external quantum efficiency as a whole.

CITATION LIST

Patent Literature

Patent Literature 1 (PTL 1): JP2015216352A

SUMMARY

Technical Problem

JP2015216352A discusses that, higher transmittance of a p-type contact layer to radiated light is more preferred. Thus, we have studied this finding and experimentally found out that an excessively high Al composition ratio of a p-type contact layer made of AlGaN in an attempt to increase the transmittance of the p-type contact layer to the center emission wavelength might cause the following phenomenon. Specifically, group III nitride semiconductor elements having higher light output power than that of conventional ones could be obtained when a given relationship is satisfied between the center emission wavelength of the group III nitride semiconductor light emitting elements and the p-type contact layer. However, a sudden drop in light output power to nearly the half of the initial light output power was observed in some of the group III nitride semiconductor light emitting element samples. As used therein, such a sudden drop in light output power will be referred to as a "sudden death". Specifically, a "sudden death" of a group III nitride semiconductor light emitting element is defined as a decline in light output power measured upon a subsequent measurement to a half or smaller of the initial light output power measured upon an initial measurement by feeding a 20-mA current, when a 100-mA current is fed for 3 seconds and then the subsequent measurement is carried out by feeding a 20-mA current.

Such sudden deaths have not been observed in conventional group III nitride semiconductor elements having a p-type contact layer made of GaN. Even if there is an improvement in the light output power, group III nitride semiconductor elements that may experience a sudden death are not reliable, rendering mass production of the group III nitride semiconductor elements unfeasible.

Accordingly, an object of the present disclosure is to provide a group III nitride semiconductor light emitting element having higher light output power and reliability than those of conventional ones and a method of manufacturing the same.

Solution to Problem

We diligently studied ways to address the above issues. We focused our attentions to the relationship between the center emission wavelength of a group III nitride semiconductor light emitting element and a p-type contact layer made of AlGaN. We have experimentally found out that a group III nitride semiconductor light emitting element in which this relationship satisfied a given condition experienced no sudden death and had improved light output power, i.e., external quantum efficiency, than that of conventional ones. Thus, we found out that provision of a p-type contact layer made of AlGaN that is suitable to a center emission wavelength can provide a group III nitride semiconductor light emitting element having higher light output power and reliability than those of conventional ones. It was experimentally confirmed that this finding is applicable to group III nitride semiconductor light emitting elements having emission wavelengths of 270 nm or greater and 310 nm or smaller, as well as group III nitride semiconductor light emitting elements having emission wavelengths of 270 nm or greater and 330 nm or smaller. We thus completed the present disclosure.

Specifically, the subject matter of the present disclosure is as follows:

[1] A group III nitride semiconductor light emitting element comprising, in this order:
  a substrate;
  an n-type semiconductor layer;
  a light emitting layer;
  a p-type electron blocking layer;
  a p-type contact layer made of $Al_xGa_{1-x}N$; and
  a p-side reflection electrode,
wherein a center emission wavelength of light emitted from the light emitting layer is 270 nm or greater and 330 nm or smaller,
the p-type contact layer is in contact with the p-side reflection electrode, and the p-type contact layer has a thickness of 20 nm or greater and 80 nm or smaller, and
an Al composition ratio x of the p-type contact layer satisfies the following Formula (1):

$$2.09-0.006 \times \lambda_p \leq x \leq 2.25-0.006 \times \lambda_p \qquad \text{Formula (1)}$$

in Formula (1), $\lambda_p$ is the center emission wavelength in nanometer.

[2] A group III nitride semiconductor light emitting element comprising, in this order:
  a substrate;
  an n-type semiconductor layer;
  a light emitting layer;
  a p-type electron blocking layer;
  a p-type contact layer made of $Al_xGa_{1-x}N$; and
  a p-side reflection electrode,
wherein a center emission wavelength of light emitted from the light emitting layer is 270 nm or greater and 310 nm or smaller,
the p-type contact layer is in contact with the p-side reflection electrode, and has a thickness of 20 nm or greater and 80 nm or smaller, and
an Al composition ratio x of the p-type contact layer satisfies the following Formula (1):

$$2.09-0.006 \times \lambda_p \leq x \leq 2.25-0.006 \times \lambda_p \qquad \text{Formula (1)}$$

in Formula (1), $\lambda_p$ is the center emission wavelength in nanometer.

[3] The group III nitride semiconductor light emitting element of [1] or [2], wherein the p-type contact layer has a high concentration region having a Mg concentration of $3 \times 10^{20}$ atoms/cm$^3$ or greater on a side contacting the p-side reflection electrode.

[4] The group III nitride semiconductor light emitting element of any of [1] to [3], wherein the Al composition ratio x of the p-type contact layer satisfies the following Formula (2):

$$2.14-0.006 \times \lambda_p \leq x \leq 2.24-0.006 \times \lambda_p \qquad \text{Formula (2)}$$

in Formula (2), $\lambda_p$ is the center emission wavelength in nanometer.

[5] A method of manufacturing a group III nitride semiconductor light emitting element, comprising:
  a step of forming an n-type semiconductor layer, a light emitting layer, and a p-type electron blocking layer on a substrate in this order;
  a p-type contact layer formation step of forming a p-type contact layer made of $Al_xGa_{1-x}N$ on the p-type electron blocking layer;
  a step of forming a p-side reflection electrode directly on the p-type contact layer;
wherein the light emitting layer is formed such that a center emission wavelength therefrom is 270 nm or greater and 330 nm or smaller, and
the p-type contact layer formation step comprises forming the p-type contact layer such that the p-type contact layer has a thickness of 20 nm or greater and 80 nm or smaller, and an Al composition ratio x of the p-type contact layer satisfies the following Formula (1):

$$2.09-0.006 \times \lambda_p \leq x \leq 2.25-0.006 \times \lambda_p \qquad \text{Formula (1)}$$

in Formula (1), $\lambda_p$ is the center emission wavelength in nanometer.

[6] A method of manufacturing a group III nitride semiconductor light emitting element, comprising:
  a step of forming an n-type semiconductor layer, a light emitting layer, and a p-type electron blocking layer on a substrate in this order;
  a p-type contact layer formation step of forming a p-type contact layer made of $Al_xGa_{1-x}N$ on the p-type electron blocking layer;
  a step of forming a p-side reflection electrode directly on the p-type contact layer;
wherein a center emission wavelength of light emitted from the light emitting layer is 270 nm or greater and 310 nm or smaller, and the p-type contact layer formation step comprises forming the p-type contact layer such that the p-type contact layer has a thickness of 20 nm or greater and 80 nm or smaller, and an Al composition ratio x of the p-type contact layer satisfies the following Formula (1):

$$2.09-0.006 \times \lambda_p \leq x \leq 2.25-0.006 \times \lambda_p \qquad \text{Formula (1)}$$

in Formula (1), $\lambda_p$ is the center emission wavelength in nanometer.

[7] The method of manufacturing a group III nitride semiconductor light emitting element of [5] or [6], wherein the p-type contact layer formation step comprises:
  a first step of growing a crystal of a layer made of $Al_xGa_{1-x}N$ by supplying a group III source gas, a group V source gas, and a Mg source gas; and a second step of reducing a flow rate of the group III source gas to one fourth or less of the flow rate of the group III source gas in the first step immediately after an end of the first step, while continuing to supply the group V source gas and the Mg source gas continuously from the first step for 1 minute or longer and 20 minutes or shorter.

Advantageous Effect

In accordance with the present disclosure, a group III nitride semiconductor light emitting element having higher light output power and reliability than those of conventional ones and a method of manufacturing the same are provided.

BRIEF DESCRIPTION OF THE DRAWINGS

In the accompanying drawings:

FIG. 3 is a schematic cross-sectional view illustrating a preferred embodiment of the method of manufacturing a group III nitride semiconductor light emitting element according to the present disclosure;

DETAILED DESCRIPTION

Figure 1:
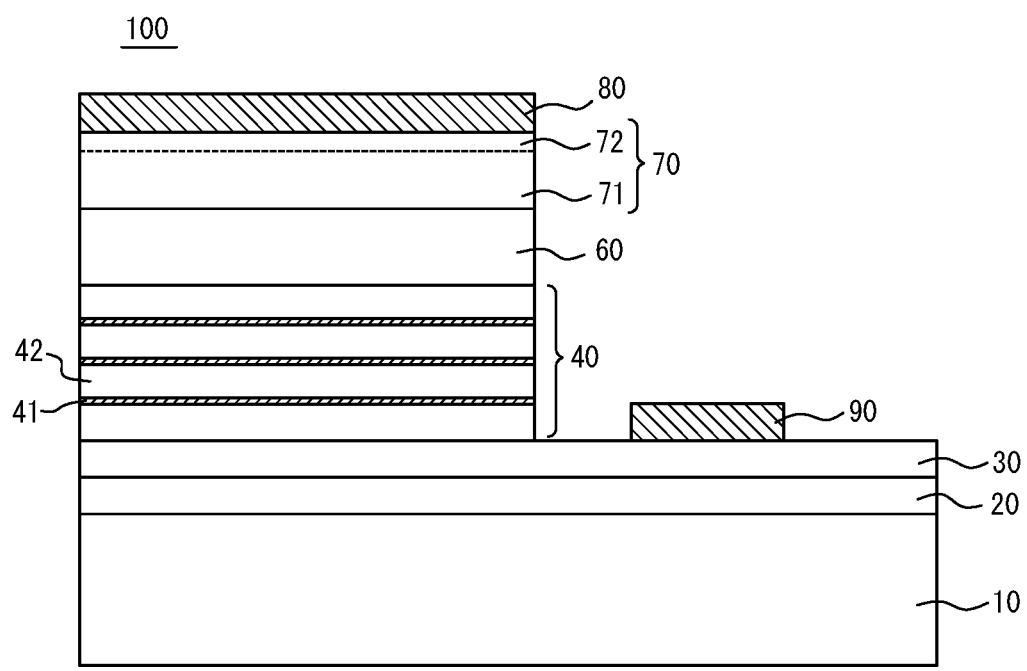
FIG. 1 is a schematic cross-sectional view illustrating a group III nitride semiconductor light emitting element 100 according to an embodiment of the present disclosure.

Prior to describing embodiments of this disclosure, the following points are described beforehand. First, the term "AlGaN" alone for which the Al composition ratio is not specified means a given compound having a chemical composition ratio of group III elements (Al and Ga in total) with respect to N of 1:1 and any given ratio between the group III elements of Al and Ga. In this case, even if no reference is made to In that is a group III element, In may be contained at 5% or less with respect to the III elements of Al and Ga. In addition, the term "AlN" or "GaN" alone does not mean the composition ratio contains Ga or Al, respectively. Yet, the simple term "AlGaN" does not exclude AlN and GaN. Note that the value of the Al composition ratio can be measured for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Mg and Si and does not serve as an electrically p-type or n-type layer is referred to as an "i-type" or "undoped" layer. An undoped layer may contain impurities that are inevitably mixed in the production process. Specifically, when the carrier density is low (e.g., less than $4 \times 10^{16}/cm^3$), the layer is regarded as being "undoped" in this specification. Further, the values of the impurity concentrations of Mg, Si, etc. are determined by SIMS analyses.

The total thickness of the epitaxially grown layers can be measured using an interference thickness measurement system. Further, when the composition ratios of the adjacent layers are sufficiently different (e.g., the Al composition ratio differs by 0.01 or more), the thickness of each layer can be calculated by observing the cross sections of the grown layers using a transmission electron microscope (TEM). The boundary between two adjacent layers that have the same or substantially the same Al composition ratios (e.g., the difference is less than 0.01) but have different impurity concentrations, and the thicknesses of these layers can be determined based on TEM-EDS. The impurity concentrations of these layers can be measured by SIMS analyses. When each of layers is thin as in the case of superlattice structures, the thickness can be measured using TEM-EDS.

Embodiments of this disclosure will now be described with reference to the drawings. In principle, like components are denoted by the same reference numerals, and the description of those components will not be repeated. A substrate and layers in each diagram are exaggerated for the sake of explanation, so that the mode ratio does not conform to the actual ratio.

First Embodiment (Embodiment: Group III Nitride Semiconductor Light Emitting Element 100)

Referring to FIG. 1, a group III nitride semiconductor light emitting element 100 in accordance with an embodiment of the present disclosure comprises a substrate 10, an n-type semiconductor layer 30, a light emitting layer 40, a p-type electron blocking layer 60, a p-type contact layer 70 made of $Al_xGa_{1-x}N$, and a p-side reflection electrode 80, in this order. The center emission wavelength from the light emitting layer 40 is 270 nm or greater and 310 nm or smaller. Further, the p-type contact layer 70 is in contact with the p-side reflection electrode 80, the p-type contact layer 70 has a thickness of 20 nm or greater and 80 nm or smaller, and the Al composition ratio x of the p-type contact layer 70 satisfies the following Formula (1):

$$2.09-0.006 \times \lambda_p \leq x \leq 2.25-0.006 \times \lambda_p \quad \text{Formula (1)}$$

in the above Formula (1), $\lambda_p$ is the center emission wavelength (nm).

Initially, details of the above-described elements, which are main components of the group III nitride semiconductor element 100 in accordance with this embodiment, will be described with reference to FIG. 1. Specific modes of elements other than those illustrated in FIG. 1 will be described later.

<Substrate>

The substrate 10 is preferably a substrate that transmits light emitted by the light-emitting layer 40, and may be a sapphire substrate or a single-crystalline AlN substrate, for example. Alternatively, an AlN template substrate may also be used as the substrate 10 in which an undoped AlN layer is epitaxially grown on the surface of a sapphire substrate.

<n-Type Semiconductor Layer>

The n-type semiconductor layer 30 is provided on the substrate 10. The n-type semiconductor layer 30 may be a typical n-type layer, which can be made of AlGaN, for example. The n-type semiconductor layer 30 is doped with an n-type dopant, thereby functioning as an n-type layer. Examples of the n-type dopant include Si, Ge, Sn, S, O, Ti, and Zr. The dopant concentration of the n-type dopant is not limited as long as the n-type semiconductor layer 30 can serve as an n-type layer. For example, the dopant concentration can be $1.0 \times 10^{18}$ atoms/$cm^3$ to $1.0 \times 10^{20}$ atoms/$cm^3$. When the n-type semiconductor layer 30 is made of AlGaN, the Al composition ratio thereof is not particularly limited and may be within typical ranges. The n-type semiconductor layer 30 may be configured from a single layer or multiple layers.

<Light-Emitting Layer>

The light-emitting layer 40 is provided on the n-type semiconductor layer 30. The light-emitting layer 40 in the present embodiment is provided such that the light-emitting layer 40 emits light having a center emission wavelength of 270 nm to 310 nm. When the light emitting layer 40 has a single-layered structure of AlGaN, the Al composition ratio a of the light emitting layer 40 may be set to fall within the range of $0.29 \leq a \leq 0.55$ such that the center emission wavelength becomes 270 nm or greater and 310 nm or smaller. In this case, the composition of the light emitting layer 40 is represented as $Al_aGa_{1-a}N$.

The light emitting layer 40 may be configured from a single layer as described above, yet the light emitting layer 40 preferably has a multiple quantum well (MQW) structure in which well layers 41 and barrier layers 42 made of AlGaN of different Al composition ratios are repeatedly formed. In this case, the Al composition ratio w of the well layers 41 may be set to fall within the range $0.29 \leq w \leq 0.55$ such that the center emission wavelength becomes 270 nm or greater and 310 nm or smaller. In addition, the Al composition ratio b of the barrier layers 42 may be set so as to be higher than the Al composition ratio w of the well layers 41 (in other words, b>w), and the Al composition ratio b of the barrier layers 42 may satisfy $0.40 \leq b \leq 1.0$ under the condition that b>w is satisfied, for example. Further, the number of repetitions of the well layers 41 and the barrier layers 42 is not limited in particular, and can be for example one to ten. The layers on both ends of the light emitting layer 40 in the thickness direction (i.e., the top and bottom layers) are preferably barrier layers. Accordingly, when the number of repetitions of the well layers 41 and the barrier layers 42 is n, those layers are referred to as "n.5 pairs of well layers and barrier layers". The thickness of the well layers 41 can be 0.5 nm to 5 nm, and the thickness of the barrier layers 42 can be 3 nm to 30 nm.

<p-Type Electron Blocking Layer>

The p-type electron blocking layer 60 is provided on the light emitting layer 40. The p-type electron blocking layer 60 is a layer to block flows of electrons and inject the electrons into the light emitting layer 40 (the well layers 41 in the case when the light emitting layer 40 has an MQW structure) thereby improving the electron injection efficiency. For that purpose, the Al composition ratio z of the p-type electron blocking layer 60 preferably satisfies $0.5 \leq z \leq 0.95$. Note that when the Al composition ratio z is 0.5 or more, the p-type electron blocking layer 60 may contain up to 5% of In with respect to the amount of the group III elements of Al and Ga. Here, when the light emitting layer 40 has a multiple quantum structure having the barrier layers 42 as described above, preferably the Al composition ratio z satisfies the above conditions and is higher than the Al composition ratio b of the barrier layers 42 and the Al composition ratio x of the p-type contact layer 70. In other words, z>b is satisfied and z>x is also satisfied. Here, both the Al composition ratio z of the p-type electron blocking layer 60 and the Al composition ratio b of the barrier layers 42 both preferably satisfy $0 < z-b \leq 0.55$, and more preferably satisfy $0.1 \leq z-b \leq 0.55$. This ensures that the p-type electron blocking layer 60 to have an increased efficiency of electron injection to the well layers 41. The p-type electron blocking layer 60 is preferably a single-layered structure having a constant AlGaN composition ratio.

The thickness of the p-type electron blocking layer 60 is preferably, but not limited to, 10 nm to 80 nm, for example. The thickness of the p-type electron blocking layer 60 in this range ensures a high light output power. Note that the p-type electron blocking layer 60 is preferably thicker than the barrier layers 42. Examples of p-type dopants doped in the p-type electron blocking layer 60 include Mg, Zn, Ca, Be, and Mn, and typically Mg is used. The dopant concentration of the p-type electron blocking layer 60 is not particularly limited as long as the layer can serve as p-type, and can be $1.0 \times 10^{18}$ atoms/cm$^3$ to $5.0 \times 10^{21}$ atoms/cm$^3$, for example.

<p-Type Contact Layer>

The p-type contact layer 70 is provided on the p-type electron blocking layer 60. The p-type contact layer 70 is a layer for reducing the contact resistance between a p-side reflection electrode 80 to be provided thereon and the p-type electron blocking layer 60. As used therein, the expression "the p-type contact layer 70 is in contact with the p-side reflection electrode 80" means that there is no structure between the p-type contact layer 70 and the p-side reflection electrode 80 except for any impurities that are unavoidable in manufacturing.

As set forth above, the p-type contact layer 70 is made of $Al_xGa_{1-x}N$, and the p-type contact layer 70 has a thickness of 20 nm or greater and 80 nm or smaller. Further, the Al composition ratio x of the p-type contact layer 70 satisfies the following Formula (1). The technical significance of the p-type contact layer 70 satisfying this condition will be described below together with the details of the p-side reflection electrode 80.

$$2.09 - 0.006 \times \lambda_p \leq x \leq 2.25 - 0.006 \times \lambda_p \quad \text{Formula (1)}$$

In the above Formula (1), $\lambda_p$ is the center emission wavelength (nm) of the group III nitride semiconductor light emitting element 100. Therefore, $270 \leq \lambda_p \leq 310$ is satisfied.

<p-Side Reflection Electrode>

The p-side reflection electrode 80 is provided directly on the p-type contact layer 70. The p-side reflection electrode 80 is made using a metal having a high reflectivity (e.g., 60% or higher) to ultraviolet light having a center emission wavelength of 270 nm or greater and 310 nm or smaller such that light emitted from the light emitting layer 40 is reflected. Examples of metals having such reflectivity include rhodium (Rh), platinum (Pt), iridium (Ir), ruthenium (Ru), molybdenum (Mo), tungsten (W), tantalum (Ta), and alloys containing at least one of these metals. These metals or alloys have higher reflectivity to ultraviolet light and can provide relatively good ohmic contact between the p-type contact layer 70 and the p-side reflection electrode 80. Of these, the p-side reflection electrode 80 preferably contains rhodium (Rh) in the form of elemental metal or an alloy from the perspective of the reflectivity. The thickness, the shape, and the size of the p-side reflection electrode 80 can be suitably selected in accordance with the shape and the size of the group III nitride semiconductor light emitting element 100. The thickness of the p-side reflection electrode 80 may be 30 nm to 45 nm, for example.

In the meantime, when the Al composition ratio x of the p-type contact layer 70 is relatively low, the p-type contact layer 70 absorbs almost all light emitted from the light emitting layer 40. Hence, a light-extraction effect from reflection by the p-side reflection electrode 80 can be hardly expected. An absorption by the p-type contact layer 70 becomes remarkable as the center emission wavelength $\lambda_p$ is shorter. In contrast, as the Al composition ratio x of the p-type contact layer 70 increases, the p-type contact layer 70 transmits light emitted from the light emitting layer 40, resulting in an increase in the light extraction efficiency attributable to reflection by the p-side reflection electrode 80. A higher Al composition ratio x of the p-type contact layer 70, however, increases the contact resistance of the p-type contact layer 70, which hinders establishment of a satisfactory ohmic contact between the p-type contact layer 70 and the p-side reflection electrode 80, resulting in increases in forward voltage (Vf) and incidence of sudden deaths.

We experimentally confirmed that sudden death might occur when the Al composition ratio x exceeded the upper limit of the above Formula (1), which is considered to be attributable to the aforementioned factors. On the other hand, when the Al composition ratio x becomes smaller than the minimum range of the above Formula (1), the hole concentration in the p-type contact layer 70 decreases as compared to the hole concentration in p-type GaN contact layers of conventional art. Further, the effect of improving the output cannot be achieved because the transmittance of the p-type contact layer 70 to light emitted from the light emitting layer 40 is not high enough and hence absorption of emitted light occurs. Accordingly, although an Al composition ratio x satisfying the range of the above Formula (1) increases the specific resistance of the p-type contact layer 70, the transmittance of the p-type contact layer 70 is increased and the effect of improving the light output power can be achieved by regulating the transmission distance of light emitted from the light emitting layer 40. Thus, the p-type contact layer 70 having an Al composition ratio x satisfying the following Formula (1) and having a thickness of 20 nm or greater and 80 nm or smaller can provide a group III nitride semiconductor light emitting element having higher light output power and reliability than those of conventional ones.

Further, in order to ensure the aforementioned effects, the Al composition ratio x of the p-type contact layer preferably satisfies the following Formula (2):

$$2.14-0.006 \times \lambda_p \leq x \leq 2.24-0.006 \times \lambda_p \quad \text{Formula (2)}$$

in the above Formula (2), $\lambda_p$ is the above-described center emission wavelength (nm).

Further, in order to ensure the aforementioned effects, the thickness of the p-type contact layer 70 is preferably 30 nm or greater, and more preferably 40 nm or greater. Further, the thickness of the p-type contact layer 70 is preferably 70 nm or smaller, and more preferably 60 nm or smaller.

In addition, as illustrated in FIG. 1, the p-type contact layer 70 preferably has a high concentration region 72 having a Mg concentration of $3 \times 10^{20}$ atoms/cm$^3$ or greater on the side contacting the p-side reflection electrode 80, and more preferably the Mg concentration of the high concentration region 72 is $5 \times 10^{20}$ atoms/cm$^3$ or greater. The high concentration region 72 increases the hole concentration in the p-type contact layer 70, which reduces the forward voltage Vf. The upper limit of the Mg concentration in the high concentration region 72 in this embodiment may be, but is not limited to, $1 \times 10^{21}$ atoms/cm$^3$ considering the industrial productivity. In this case, the Mg concentration in the region 71 on the p-type electron blocking layer 60 side of the p-type contact layer 70 may be within typical ranges, and is typically $5 \times 10^{19}$ atoms/cm$^3$ or greater and smaller than $3 \times 10^{20}$ atoms/cm$^3$. Note that the Mg concentrations in the region 71 and the high concentration region 72 are the average concentrations of those regions determined by SIMS measurements. The thickness of the high concentration region 72 is typically 15 nm or smaller for maintaining the crystallinity of the p-type contact layer 70.

As set forth above, according to this embodiment, a group III nitride semiconductor light emitting element having higher light output power and higher reliability than those of conventional ones can be provided. Since the p-side reflection electrode reflects light emissions in this group III nitride semiconductor light emitting element, the main light extraction direction may be the substrate side or the horizontal direction of the substrate.

While specific modes applicable to this embodiment will be described, this embodiment is not limited to the following modes.

<Buffer Layer>

As illustrated in FIG. 1, a buffer layer 20 for reducing any strain induced by the difference of the lattice constants is preferably provided between the substrate 10 and the n-type semiconductor layer 30. The buffer layer 20 is preferably made of AlN or AlGaN. When an AlN template substrate is used as the substrate 10 as set forth above, the AlN layer on the surface of the AlN template substrate serves as the buffer layer 20, yet an AlGaN layer as the buffer layer 20 may also be formed on the AlN layer.

<n-Side Electrode>

The n-side electrode 90 that may be provided on an exposed surface of the n-type semiconductor layer 30 can be formed, for example, as a metal composite film having a Ti-containing film and an Al-containing film formed on the Ti-containing film. The thickness, the shape, and the size thereof may be suitably selected according to the shape and the size of the light emitting element. The n-side electrode 90 may not be necessarily formed on the exposed surface of the n-type semiconductor layer 30 as depicted in FIG. 1, and the n-side electrode 90 may be formed on any other location as long as it is electrically coupled to the n-type semiconductor layer.

<Other Structures>

Although not illustrated in FIG. 1, a guide layer made of a group III nitride semiconductor layer having a higher Al composition ratio than that of the Al composition ratio z of the p-type electron blocking layer 60 may be provided between light emitting layer 40 and the p-type electron blocking layer 60. Such a guide layer can promote injection of holes into the light emitting layer 40.

(Method of Manufacturing Group III Nitride Semiconductor Light Emitting Element)

Next, an embodiment of a method of manufacturing the aforementioned group III nitride semiconductor light emitting element 100 will be described with reference to FIG. 2. An embodiment of the method of manufacturing the group III nitride semiconductor light emitting element 100 according to the present disclosure comprises a step of forming an n-type semiconductor layer 30, a light emitting layer 40, and a p-type electron blocking layer 60 on a substrate 10 in this order (Step 2A and Step 2B in FIG. 2); a p-type contact layer formation step of forming a p-type contact layer 70 made of $Al_xGa_{1-x}N$ on the p-type electron blocking layer 60 (Step 2C in FIG. 2); and a step of forming a p-side reflection electrode 80 directly on the p-type contact layer 70 (Step 2D in FIG. 2). The light emitting layer 40 is formed such that the center emission wavelength therefrom is 270 nm or greater and 310 nm or smaller. Further, the p-type contact layer formation step illustrated in Step 2C in FIG. 2 comprises forming the p-type contact layer 70 such that the p-type contact layer has a thickness of 20 nm or greater and 80 nm or smaller, and the Al composition ratio x of the p-type contact layer satisfies the following Formula (1):

$$2.09-0.006 \times \lambda_p \leq x \leq 2.25-0.006 \times \lambda_p \quad \text{Formula (1)}$$

in the above Formula (1), $\lambda_p$ is the center emission wavelength (nm).

Figure 2:
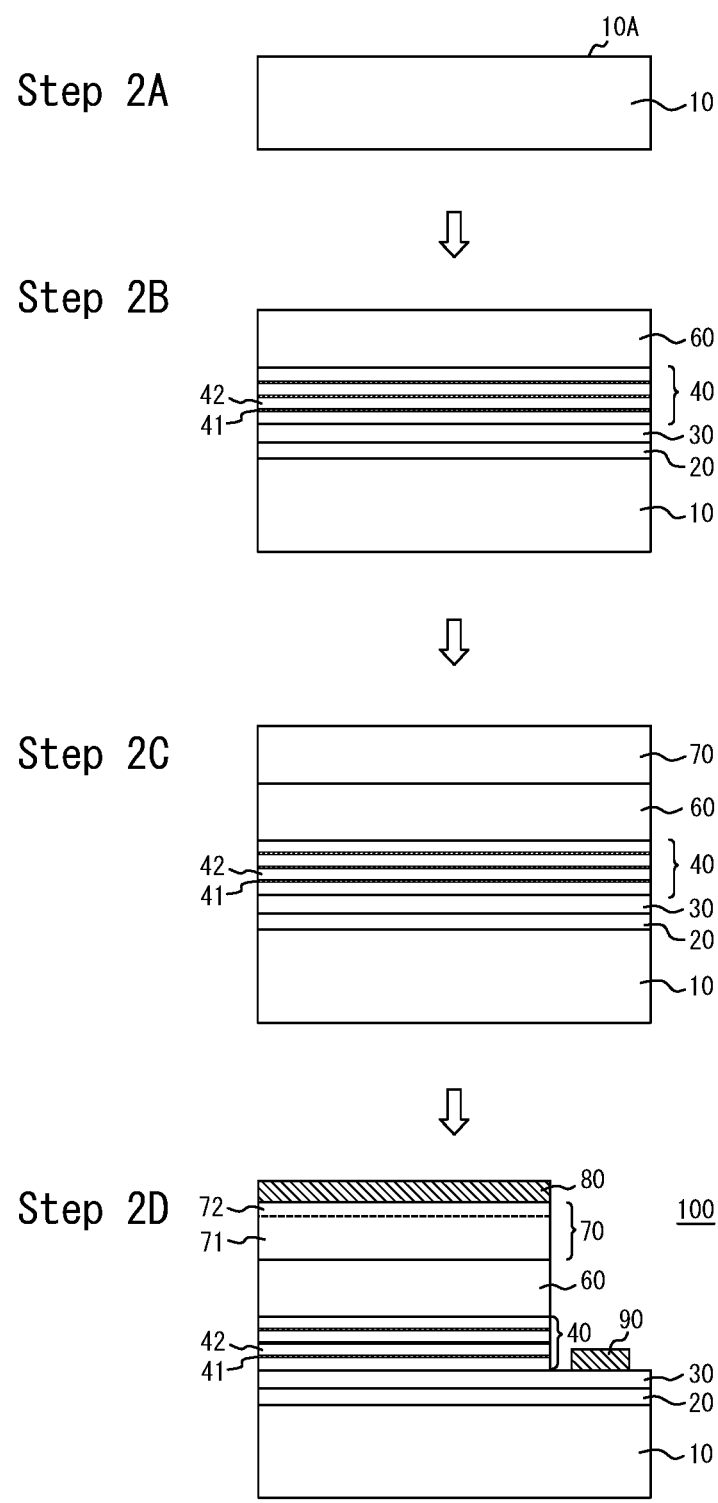
FIG. 2 is a schematic cross-sectional view illustrating a method of manufacturing a group III nitride semiconductor light emitting element 100 according to an embodiment of the present disclosure.

Referring to FIG. 2 illustrating a flowchart according to a preferred embodiment of this embodiment, a specific mode and details of each step will be described in this order. Explanations that are common to the aforementioned embodiment will be omitted.

Initially, as illustrated in Step 2A and Step 2B in FIG. 2, in the step of forming the n-type semiconductor layer 30, the light emitting layer 40, and the p-type electron blocking layer 60 on the substrate 10 in this order, each layer may be formed by any of well-known epitaxial growth techniques, such as metal organic chemical vapor deposition (MOCVD), molecular beam epitaxy (MBE), and sputtering.

Typical conditions according to the Al composition ratio and the thickness of the each layer may be used as the growth temperature, the growth pressure, and the growth time for epitaxial growth of each of the n-type semiconductor layer 30, the light emitting layer 40, and the p-type electron blocking layer 60. As a carrier gas for the epitaxial growth, hydrogen or nitrogen gas, or a mixed gas thereof may be supplied to a chamber. Further, examples of the source gases for the growth of each layer include TMA (trimethylaluminum) and TMG (trimethylgallium) as source gases of group III elements, and $NH_3$ gas as a group V element source gas. A typically used condition may also be used for the mole ratio of the group III elements to the group V elements (hereinafter referred to as the "V/III ratio"), which is calculated based on the flow rates of the growth gases, such as the group V element gas (e.g., $NH_3$ gas) and the group III element gas (e.g., TMA gas). Bis(cyclopentadienyl)magnesium gas ($CP_2Mg$) and the like as the Mg source as a p-type dopant, and monosilane gas ($SiH_4$) as a Si source or zinc chloride gas ($ZnCl_2$) as a Zn source as a n-type dopant may be suitably selected as dopant source gases, and may be supplied to the chamber at certain flow rates, for example.

Next, in the p-type contact layer formation step illustrated in Step 2C in FIG. 2, a p-type contact layer 70 made of $Al_xGa_{1-x}N$ is formed on the p-type electron blocking layer 60. The thickness range of the p-type contact layer 70 and the condition of the Al composition ratio x have been described above. The p-type contact layer 70 may also be formed by epitaxial growth using MOCVD or the like.

Here, in order to obtain an Mg concentration in the high concentration region 72 of $3\times10^{20}$ atoms/cm$^3$ or greater in the p-type contact layer 70 on the side contacting the p-side reflection electrode 80, the p-type contact layer formation step preferably comprises first and second steps as follows. Specifically, the p-type contact layer formation step preferably comprises: a first step of growing a crystal of a layer made of $Al_xGa_{1-x}N$ by supplying a group III source gas, a group V source gas, and an Mg source gas; and a second step of reducing the flow rate of the group III source gas to one fourth or less of the flow rate of the group III source gas in the first step immediately after the end of the first step, while continuing to supply the group V source gas and the Mg source gas continuously from the first step for 1 minute or longer and 20 minutes or shorter. This preferred mode will be explained with reference to FIG. 3.

Initially, as illustrated in Step 3A and Step 3B in FIG. 3, in the first step, a crystal of a layer made of $Al_xGa_{1-x}N$ is grown by supplying a group III source gas, a group V source gas, and an Mg source gas. In this first step, a p-type contact layer 70 made of $Al_xGa_{1-x}N$ may be epitaxial grown using typical conditions. In the subsequent second step, immediately after the end of the first step, the flow rate of the group III source gas is reduced to the one fourth or less of the flow rate of the group III source gas in the first step. At the same time, the group V source gas and the Mg source gas are continued to be supplied for 1 minute or longer and 20 minutes or shorter continuously with the first step. The provision of the first and second steps increases the probability of presence of Mg in the region 71, which is the surface layer part of the p-type contact layer 70, thereby enabling formation of the high Mg concentration region. Formation of the high Mg concentration region 72 after the second step is schematically illustrated in Step 3C in FIG. 3.

In the aforementioned second step, more preferably, the flow rate of the group III source gas is reduced to the one tenth or less of the flow rate in the first step, and even more preferably, the supply of the group III source gas is shut off. This ensures a high Mg concentration in the high concentration region 72.

Then, after the p-type contact layer 70 is formed, as illustrated in Step 2D in FIG. 2 and Step 3D in FIG. 3, a p-side reflection electrode 80 is formed directly on the p-type contact layer 70. The p-side reflection electrode 80 may be formed by sputtering, or vacuum evaporation, or the like.

Further, as illustrated in Step 2B to Step 2D in FIG. 2, a buffer layer 20 may be formed on the surface 10A of the substrate 10. Then, parts of the light emitting layer 40, the p-type electron blocking layer 60, and the p-type contact layer 70 may be removed by etching or the like, and an n-side electrode 90 can be formed on the exposed part of the n-type semiconductor layer 30.

Second Embodiment

While the center emission wavelength from the light emitting layer 40 is 270 nm or greater and 310 nm or smaller in the aforementioned first embodiment, the present disclosure is also applicable to group III nitride semiconductor light emitting elements having a center emission wavelength from a light emitting layer of 270 nm or greater and 330 nm or smaller. More specifically, a group III nitride semiconductor light emitting element 100 in accordance with a second embodiment of the present disclosure comprises a substrate 10, an n-type semiconductor layer 30, a light emitting layer 40, a p-type electron blocking layer 60, a p-type contact layer 70 made of $Al_xGa_{1-x}N$, and a p-side reflection electrode 80, in this order. The center emission wavelength from the light emitting layer 40 is 270 nm or greater and 330 nm or smaller. Further, the p-type contact layer 70 is in contact with the p-side reflection electrode 80, the p-type contact layer 70 has a thickness of 20 nm or greater and 80 nm or smaller, and the Al composition ratio x of the p-type contact layer 70 satisfies the above Formula (1). The elements that are the same as those in FIGS. 1-3 are denoted by the same reference symbols, and any redundant explanations will be omitted. Thus, the range: $270 \leq \lambda_p \leq 330$ is adopted as the numerical range of $\lambda_p$ in the above Formulae (1) and (2).

A method of manufacturing the group III nitride semiconductor light emitting element 100 where the center emission wavelength from the light emitting layer is 270 nm or greater and 330 nm or smaller according to the second embodiment comprises a step of forming an n-type semiconductor layer 30, a light emitting layer 40, and a p-type electron blocking layer 60 on a substrate 10 in this order, a p-type contact layer formation step of forming a p-type contact layer 70 made of $Al_xGa_{1-x}N$ on the p-type electron blocking layer 60, and a step of forming a p-side reflection electrode 80 directly on the p-type contact layer 70. The light emitting layer 40 is formed such that the center emission wavelength therefrom is 270 nm or greater and 330 nm or smaller. In a p-type contact layer formation step, a p-type contact layer 70 is formed such that the p-type contact layer has a thickness of 20 nm or greater and 80 nm or smaller, and an Al composition ratio x of the p-type contact layer satisfies the above Formula (1).

When the light emitting layer 40 has a single-layered structure of AlGaN, the Al composition ratio a of the light emitting layer 40 may be set to fall within the range $0.17 \leq a \leq 0.55$ such that the center emission wavelength becomes 270 nm or greater and 330 nm or smaller. Or, when the light emitting layer 40 is configured as a multiple quantum well structure including the well layers 41 and the barrier layers 42, the Al composition ratio w of the well layers 41 may be set to fall within the range $0.17 \leq w \leq 0.55$, while the Al composition ratio b of the barrier layers 42 is set so as to satisfy $0.30 \leq b \leq 1.0$ under the condition that $b > w$ is satisfied.

EXAMPLES

Experimental Example 1

Example 1

The present disclosure will be described in more detail below using Examples. However, the present disclosure is not limited to the following Examples. A group III nitride semiconductor light emitting element according to Example 1 was fabricated in accordance with the flowchart depicted in FIG. 2. Initially, a sapphire substrate (diameter: 2 inches, thickness: 430 µm, and plane orientation: (0001)) was provided. Subsequently, an AlN layer having a center thickness of 0.60 µm (average thickness: 0.61 µm) was grown on the sapphire substrate by MOCVD to prepare an AlN template substrate. In this process, the growth temperature of the AlN layer was 1300° C., the growth pressure inside the chamber was 10 Torr, and the growth gas flow rates of ammonia gas and TMA gas were selected such that the V/III ratio became 163. Upon measuring thicknesses of the AlN layer, the thicknesses of total 25 points distributed across the wafer at regular intervals, including the center of the wafer plane, were measured with an interference thickness measurement system (Nanospec M6100A manufactured by Nanometrics Incorporated).

Next, the above AlN template substrate was loaded into a heat treatment furnace. The furnace was purged with nitrogen gas to create a nitrogen gas atmosphere in the furnace, followed by raising the temperature inside the furnace, thus performing heat treatment on the AlN template substrate. The heating temperature was 1650° C. and heating time was 4 hours.

Subsequently, a buffer layer made of undoped $Al_{0.7}Ga_{0.3}N$ and having a thickness of 1 µm was formed by MOCVD. Next, an n-type semiconductor layer made of $Al_{0.65}Ga_{0.35}N$ doped with Si and having a thickness of 2 µm was formed on the buffer layer. The Si concentration of the n-type semiconductor layer determined by a SIMS analysis was $1.0 \times 10^{19}$ atoms/cm³.

Next, on the n-type semiconductor layer, well layers made of $Al_{0.45}Ga_{0.55}N$ with a thickness of 3 nm and barrier layers made of $Al_{0.64}Ga_{0.36}N$ with a thickness of 7 nm were alternately and repeatedly stacked thereby forming a quantum well structure having 3.5 pairs of the layers. The "0.5" of "3.5 pairs" means that the top and bottom layers of the light emitting layer were barrier layers.

Thereafter, a p-type electron blocking layer made of $Al_{0.68}Ga_{0.32}N$ having a thickness of 40 nm was formed on the light emitting layer using hydrogen gas as a carrier gas (Step 3D in FIG. 3). During the formations of the p-type electron blocking layer, Mg was doped by supplying $CP_2Mg$ gas as an Mg source into the chamber. The Mg concentration of the p-type electron blocking layer determined by a SIMS analysis was $5.0 \times 10^{18}$ atom/cm³.

Subsequently, a p-type contact layer made of $Al_{0.56}Ga_{0.44}N$ was formed to a thickness of 50 nm. A Mg-doped p-type contact layer was formed by supplying $CP_2Mg$ gas as a Mg source, together with TMA gas and TMG gas as group III source gases, and ammonia gas as a group V source gas, to a chamber. This step was defined as the first step of the p-type contact layer formation (Step 3B in FIG. 3). Thereafter, as illustrated in Step 3C in FIG. 3, as a second step, only the supply of the group III source gases was shut off, and the Mg source gas and the group V source gas were supplied for 10.5 minutes, to form a high concentration region on the side of the surface of the p-type contact layer.

The Al composition of the p-type contact layer was determined based on the emission wavelength (band-gap energy) of the p-type contact layer determined by photoluminescence measurement.

For the p-type contact layer, the Mg concentrations determined by SIMS analyses of the 45-nm thick portion of the p-type contact layer on the p-type electron blocking layer side (region 71) and the remaining 5-nm thick portion (the high concentration region 72) having a high Mg concentration were $1 \times 10^{20}$ atoms/cm³ and $3 \times 10^{20}$ atoms/cm³, respectively.

Thereafter, a mask was formed on the p-type contact layer, followed by mesa etching by dry etching to expose the n-type semiconductor layer. Subsequently, a p-side reflection electrode made of Rh having a thickness of 0.04 µm was formed on the p-type contact layer by sputtering, and an n-side electrode made from Ti/Al was formed on the exposed surface of the n-type semiconductor layer. In the n-side electrode, the thickness of Ti was 200 Å, and the thickness of Al was 1500 Å. Finally, a contact anneal (RTA) was carried out at 550° C. The group III nitride semiconductor light emitting element according to Example 1 was thus fabricated. The layer structure of Example 1 is listed in Table 1.

TABLE 1

|  | Al composition ratio | Dopant | Thickness |
|---|---|---|---|
| p-type contact layer | 0.56 | Mg | 50 nm |
| p-type electron blocking layer | 0.68 | Mg | 40 nm |
| Light-emitting layer | 0.64 | — | 7 nm |
|  | 0.45 | — | 3 nm |
|  | 0.64 | Si | 7 nm |
|  | 0.45 | — | 3 nm |
|  | 0.64 | Si | 7 nm |
|  | 0.45 | — | 3 nm |
|  | 0.64 | Si | 7 nm |
| n-type semiconductor layer | 0.65 | Si | 2 µm |
| Undoped layer | 0.70 | — | 1 µm |
| AlN layer | 1 | — | 0.6 µm |
| Sapphire substrate | — | — | 430 µm |

Example 2

A group III nitride semiconductor light emitting element of Example 2 was fabricated in the same manner as Example 1 except that the Al composition ratio of the p-type contact layer in Example 1 was changed to 0.46. For the p-type contact layer of the second embodiment, the Mg concentrations determined by SIMS analyses of the 45-nm thick portion of the p-type contact layer on the p-type electron blocking layer side (region 71) and the remaining 5-nm thick portion (the high concentration region 72) having a high Mg concentration formed by the second step were $1 \times 10^{20}$ atoms/cm³ and $3 \times 10^{20}$ atoms/cm³, respectively.

Example 3

A group III nitride semiconductor light emitting element of Example 3 was fabricated in the same manner as Example 1 except that the Al composition ratio of the p-type contact layer in Example 1 was changed to 0.41.

Conventional Example 1

A group III nitride semiconductor light emitting element of Conventional Example 1 was fabricated in the same manner as Example 1 except that the Al composition ratio of the p-type contact layer in Example 1 was changed to 0 (in other words, GaN was formed) and the thickness was changed to 150 nm.

Comparative Example 1

A group III nitride semiconductor light emitting element of Comparative Example 1 was fabricated in the same manner as Example 1 except that the Al composition ratio of the p-type contact layer in Example 1 was changed to 0.62.

Comparative Example 2

A group III nitride semiconductor light emitting element of Comparative Example 2 was fabricated in the same manner as Example 1 except that the Al composition ratio of the p-type contact layer in Example 1 was changed to 0.35.

Comparative Example 3

A group III nitride semiconductor light emitting element of Comparative Example 3 was fabricated in the same manner as Example 2 except that the materials of the well layers and the barrier layers were changed to $Al_{0.29}Ga_{0.71}N$ and $Al_{0.43}Ga_{0.57}N$, respectively.

Example 4

A group III nitride semiconductor light emitting element of Example 4 was fabricated in the same manner as Comparative Example 3 except that the Al composition ratio of the p-type contact layer in Comparative Example 3 was changed to 0.39.

Example 5

A group III nitride semiconductor light emitting element of Example 5 was fabricated in the same manner as Comparative Example 3 except that the Al composition ratio of the p-type contact layer in Comparative Example 3 was changed to 0.23.

Conventional Example 2

A group III nitride semiconductor light emitting element of Conventional Example 2 was fabricated in the same manner as Comparative Example 3 except that the Al composition ratio of the p-type contact layer in Comparative Example 3 was changed to 0.

The conditions to form the p-type contact layers in Examples 1-5, Conventional Examples 1 and 2, and Comparative Examples 1-3 are summarized in Table 2 below:

TABLE 2

| | Center emission wavelength $\lambda$ (nm) | Al composition ratio x of p-type contact layer | Light output power P (mW) | Forward voltage V (v) | Incidence of sudden death |
|---|---|---|---|---|---|
| Comparative Example 1 | 280 | 0.62 | 7.5 | 9.3 | 80% |
| Example 1 | 280 | 0.56 | 12.5 | 9.0 | 0% |
| Example 2 | 280 | 0.46 | 7.9 | 8.4 | 0% |
| Example 3 | 280 | 0.41 | 6.3 | 8.3 | 0% |
| Comparative Example 2 | 280 | 0.35 | 4.0 | 8.4 | 0% |
| Conventional Example 1 | 280 | 0 | 4.1 | 8.5 | 0% |
| Comparative Example 3 | 310 | 0.46 | 10.7 | 8.6 | 10% |
| Example 4 | 310 | 0.39 | 10.2 | 8.9 | 0% |
| Example 5 | 310 | 0.23 | 6.6 | 9.2 | 0% |
| Conventional Example 2 | 310 | 0 | 3.8 | 8.0 | 0% |

<Evaluation 1>

For each of semiconductor light emitting elements in Examples 1-3, Conventional Examples 1-2, and Comparative Examples 1-2, a forward voltage Vf and a light output power Po using an integrating sphere were measured when a 20-mA current was fed by a constant current voltage power supply. The measurements were made on the respective three samples and the results were averaged. The results of Examples 1-5, Conventional Examples 1-2 and Comparative Examples 1-3 are summarized in Table 2. The center emission wavelengths of elements of Examples 1-3, Conventional Example 1, and Comparative Examples 1-2 measured by an optical fiber spectrometer were all 280 nm. The center emission wavelengths of elements of Examples 4 and 5, Conventional Example 2, and Comparative Example 3 were all measured to be 310 nm.

<Evaluation 2>

Figure 4:
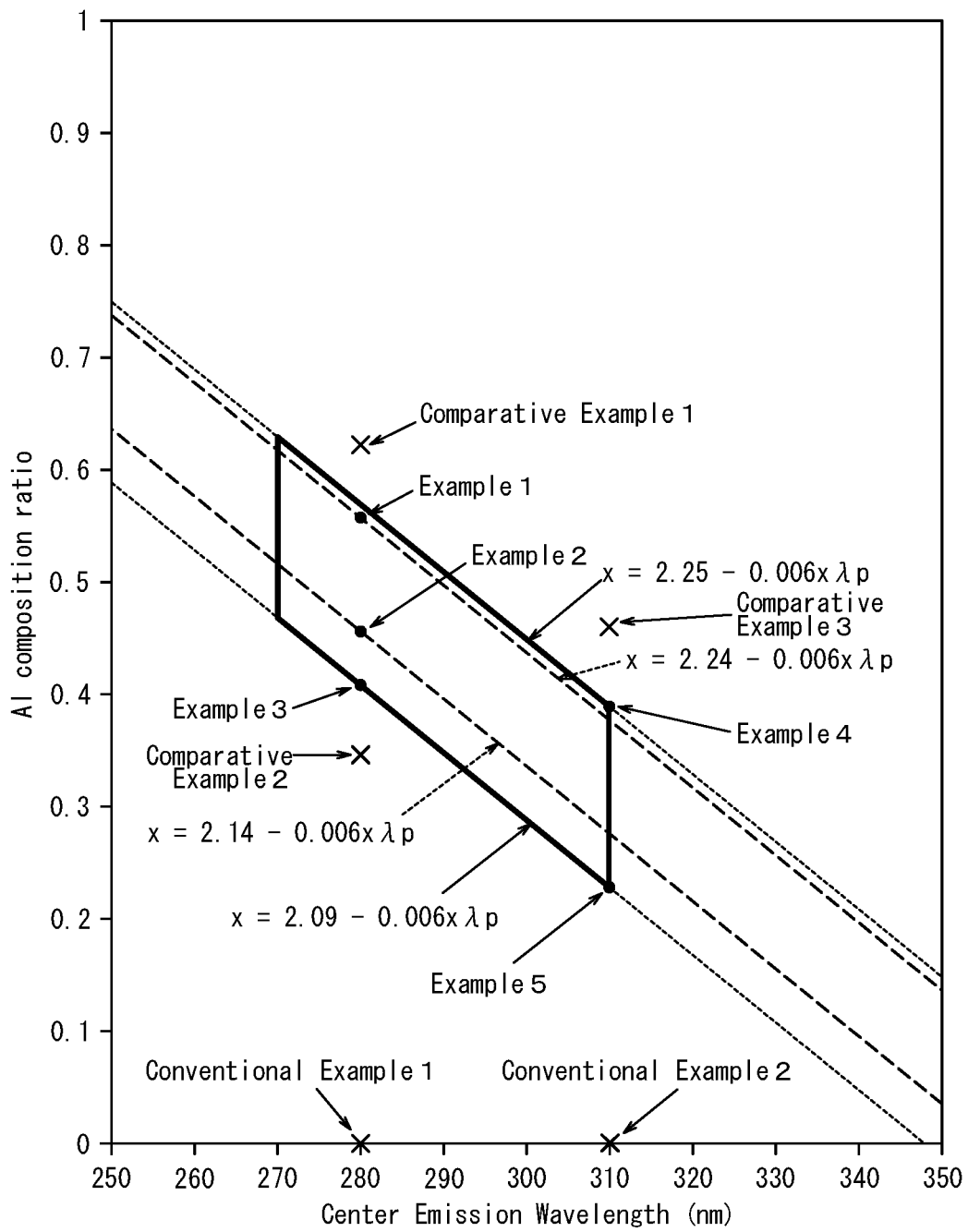
FIG. 4 is a graph indicating the relationship between center emission wavelengths of group III nitride semiconductor light emitting elements versus the Al composition ratios of p-type contact layers in Experimental Example 1 in Examples.

For each sample of Examples, Conventional Examples, and Comparative Examples, an initial light output power was measured by feeding a 20-mA current. Subsequently, a 100-mA current for was fed for 3 seconds, and then a subsequent measurement was carried out by feeding a 20-mA current. The variation of the light output power from the initial light output power was determined. Samples that experienced a decline in the light output power after the 100-mA current for 3 second to a half or smaller of the initial light output power, i.e., sudden death, were counted. The results of the incidence of sudden death are also indicated in Table 2. A graph of the center emission wavelength of the group III nitride semiconductor light emitting element $\lambda_p$ versus the Al composition ratio x of the p-type contact layer is illustrated in FIG. 4. It can be confirmed that sudden death did not occur when the Al composition ratio of the p-type contact layer was within in the region enclosed by the thick solid line in the graph of FIG. 4.

The above evaluation results suggested that sudden death was induced by a contact resistance between a p-type contact layer and a p-side electrode. The contact resistance with the p-side electrode increases with an increase in the Al composition of the p-type contact layer, which causes concentration of current and makes the electrode more prone to be destroyed. It was also confirmed that sudden death may occur when the Al composition ratio of the contact layer is greater than that of the barrier layers in the light emitting layer. Hence, the difference in the crystallinity due to stress is also assumed to be a cause of a sudden death. From the above finding, it was also found that a contact layer preferably has an Al composition ratio smaller than the Al composition ratio of the barrier layers in the light emitting layer. Further, it was also confirmed that Examples 1-5 satisfying the condition of the present disclosure provided greater improvements in the light output power, as well as preventing sudden deaths, as compared to Conventional Examples having the p-type GaN contact layers.

Experimental Example 2

Comparative Example 4

A p-type contact layer made of $Al_{0.56}Ga_{0.44}N$ having a thickness of 50 nm was formed, and then a p-type GaN layer with a thickness of 10 nm was then formed, as in Example 1. Thereafter, a p-side reflection electrode made of Rh as in Example 1 was formed on the surface of the p-type GaN layer. However, unlike Example 1, the second step for forming the p-type contact layer made of $Al_{0.56}Ga_{0.44}N$ was not carried out in Comparative Example 4. Except for the above difference, a group III nitride semiconductor light emitting element according to Comparative Example 4 was fabricated in the same conditions as those in Example 1.

Example 6

A group III nitride semiconductor light emitting element of Example 6 was fabricated in the same manner as Example 2 except that the second step was not carried out upon forming the p-type contact layer in Example 2. The thickness of p-type contact layer was 50 nm, and the Mg concentration of the p-type contact layer determined by a SIMS analysis was $1 \times 10^{20}$ atoms/cm$^3$.

<Evaluations>

For each semiconductor light emitting element of Comparative Example 4 and Example 6, the forward voltage Vf and the light output power Po by the integrating sphere were measured using the constant current voltage power supply in the same manner as in Experimental Example 1. Occurrence of sudden deaths was also confirmed in the same manner as in Experimental Example 1. The results were summarized in Table 3 together with the results of Examples 1 and 2 and Conventional Example 1 of Experimental Example 1.

TABLE 3

| | Center emission wavelength λ (nm) | p-type contact layer * Note 1 | Light output power P (mW) | Forward voltage V (v) | Incidence of sudden death |
|---|---|---|---|---|---|
| Example 1 | 280 | $Al_{0.56}Ga_{0.44}N$ (50 nm) | 12.5 | 9.0 | 0% |
| Conventional Example 1 | 280 | GaN (50 nm) | 4.1 | 8.5 | 0% |
| Comparative Example 4 | 280 | $Al_{0.56}Ga_{0.44}N$ (50 nm)/GaN (10 nm) | 6.1 | 8.4 | 0% |
| Example 2 | 280 | $Al_{0.46}Ga_{0.54}N$ (50 nm) | 7.9 | 8.4 | 0% |
| Example 6 | 280 | $Al_{0.46}Ga_{0.54}N$ (50 nm) | 7.7 | 9.2 | 0% |

Note 1:
the numbers enclosed in parentheses indicate thicknesses.

When Example 1, Conventional Example 1, and Comparative Example 4 are compared to each other, although prevention of sudden deaths could be achieved by providing the p-type GaN layer on the p-side electrode side, the light output power significantly reduced in Comparative Example 4 as compared to Example 1. This is attributable to light absorption by the p-type GaN layer. It was confirmed that the forward voltage was smaller in Example 2 than in Example 6, suggesting that the provision of a high Mg concentration region is preferred.

Experimental Example 3

Example 7

A group III nitride semiconductor light emitting element of Example 7 was fabricated in the same manner as Example 1 except that the layer structure of the layers of Example 1 of Experimental Example 1 listed in Table 1 were modified as listed in Table 4 such that a center emission wavelength became 330 nm. Note that the Al composition of the p-type contact layer 0.27 was the maximum value in Formula (1).

TABLE 4

| | Al composition ratio | Dopant | Thickness |
|---|---|---|---|
| p-type contact layer | 0.27 | Mg | 50 nm |
| p-type electron blocking layer | 0.58 | Mg | 40 nm |
| Guide layer | 1 | — | 1 nm |
| | 0.17 | — | 3 nm |
| | 0.50 | Si (%) | 7 nm |
| Light-emitting layer | 0.17 | — | 3 nm |
| | 0.50 | Si (%) | 7 nm |
| | 0.17 | — | 3 nm |
| | 0.50 | Si (%) | 7 nm |
| n-type semiconductor layer | 0.45 | Si (%) | 2 μm |
| Undoped layer | 0.55 | — | 1 μm |
| AlN layer | 1 | — | 0.6 μm |
| Sapphire substrate | — | — | 430 μm |

Example 8

A group III nitride semiconductor light emitting element of Example 8 was fabricated in the same manner as Example 7 except that the Al composition x of the p-type contact layer was set to 0.11. Note that the Al composition of the p-type contact layer of 0.11 was the lowest value of Formula (1).

Conventional Example 3

A group III nitride semiconductor light emitting element of Conventional Example 3 was fabricated in the same manner as Example 7 except that the Al composition x of the p-type contact layer was set to 0.

<Evaluations>

For each semiconductor light emitting element of Examples 7 and 8 and Conventional Example 3, the light output power Po was measured using the integrating sphere in the similar manner as in Evaluation 1 for Experimental Example 1.

Occurrence of sudden deaths was also confirmed in the same manner as in Evaluation 2 for Experimental Example 1. The results are summarized in Table 5 below. A graph of the center emission wavelength $λ_p$ versus the Al composition ratio x of the p-type contact layer in Examples 7 and 8 and Conventional Example 3 is illustrated in FIG. 5, together with the aforementioned results.

TABLE 5

|  | Center emission wavelength λ (nm) | Al composition ratio x of p-type contact layer | Light output power P (mW) | Incidence of sudden death |
|---|---|---|---|---|
| Example 7 | 330 | 0.27 | 3.6 | 0% |
| Example 8 | 330 | 0.11 | 1.3 | 0% |
| Conventional Example 3 | 330 | 0 | 1.0 | 0% |

Figure 5:
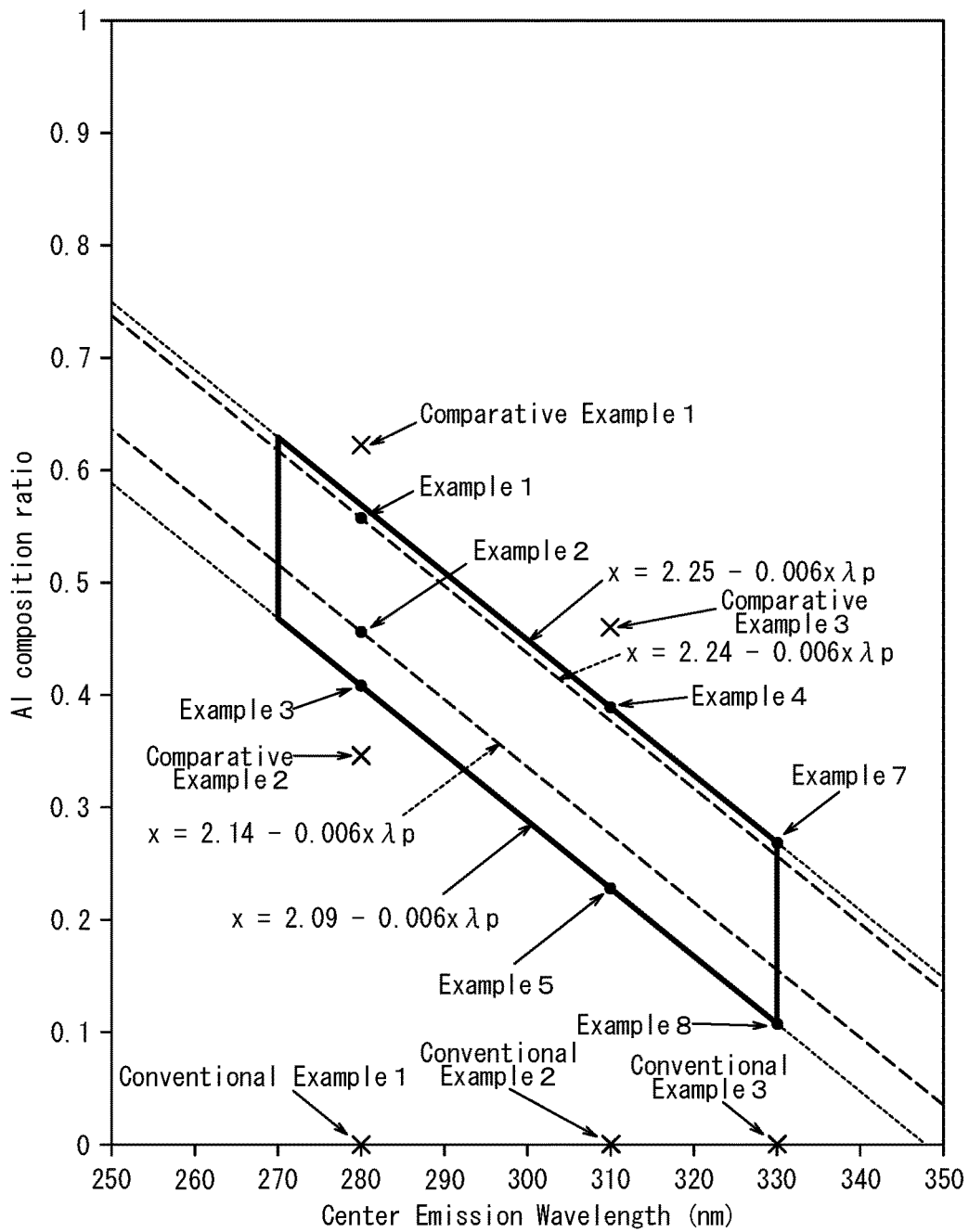
FIG. 5 is a graph indicating the relationship between center emission wavelengths of group III nitride semiconductor light emitting elements versus the Al composition ratios of p-type contact layers in Experimental Example 3 in Examples.

It was confirmed from the results of Experimental Example 3 shown in Table 5 and FIG. 5 that a light emitting element having higher light output power and reliability than those of conventional ones was obtained when the Al composition ratio x of the p-type contact layer satisfies the range of Formula (1) for a center emission wavelength $\lambda_p$ of 330 nm.

Hence, it was concluded based on the results of the experiments of the aforementioned Experimental Examples 1-3 that Formula (1) could be applicable to cases where center emission wavelengths $\lambda_p$ are 270 nm or greater and 330 nm or smaller, as well as cases where center emission wavelengths $\lambda_p$ are 270 nm or greater and 310 nm or smaller.

INDUSTRIAL APPLICABILITY

In accordance with the present disclosure, a group III nitride semiconductor light emitting element having higher light output power and reliability than those of conventional ones and a method of manufacturing the same are provided, which is useful.

REFERENCE SIGNS LIST

10 Substrate
10A Principle surface of substrate
20 Buffer layer
30 n-type semiconductor layer
40 Light emitting layer
41 Well layer
42 Barrier layer
60 p-type electron blocking layer
70 p-type contact layer
71 Region on the p-type electron blocking layer side
72 High concentration region on the side contacting p-side reflection electrode
80 n-side electrode
90 p-side reflection electrode
100 Group III nitride semiconductor light emitting element

The invention claimed is:

1. A group III nitride semiconductor light emitting element comprising, in this order:
a substrate;
an n-type semiconductor layer;
a light emitting layer;
a p-type electron blocking layer;
a p-type contact layer made of $Al_xGa_{1-x}N$; and
a p-side reflection electrode,
wherein a center emission wavelength of light emitted from the light emitting layer is 280 nm or greater and 330 nm or smaller,
the p-type contact layer is in contact with the p-side reflection electrode, and the p-type contact layer has a thickness of 20 nm or greater and 80 nm or smaller, and
an Al composition ratio x of the p-type contact layer satisfies the following Formula:

$$2.14 - 0.006 \times \lambda_p \leq x \leq 2.24 - 0.006 \times \lambda_p \quad \text{Formula (2)}$$

where $\lambda_p$ is the center emission wavelength in nanometer.

2. The group III nitride semiconductor light emitting element of claim 1,
wherein the center emission wavelength of light emitted from the light emitting layer is 280 nm or greater and 310 nm or smaller.

3. The group III nitride semiconductor light emitting element of claim 1, wherein the p-type contact layer has a high concentration region having a Mg concentration of $3 \times 10^{20}$ atoms/cm³ or greater on a side contacting the p-side reflection electrode.

4. A method of manufacturing a group III nitride semiconductor light emitting element, comprising:
a step of forming an n-type semiconductor layer, a light emitting layer, and a p-type electron blocking layer on a substrate in this order;
a p-type contact layer formation step of forming a p-type contact layer made of $Al_xGa_{1-x}N$ on the p-type electron blocking layer;
a step of forming a p-side reflection electrode directly on the p-type contact layer;
wherein the light emitting layer is formed such that a center emission wavelength therefrom is 280 nm or greater and 330 nm or smaller,
the p-type contact layer formation step comprises forming the p-type contact layer such that the p-type contact layer has a thickness of 20 nm or greater and 80 nm or smaller, and an Al composition ratio x of the p-type contact layer satisfies the following Formula:

$$2.14 - 0.006 \times \lambda_p \leq x \leq 2.24 - 0.006 \times \lambda_p$$

where $\lambda_p$ is the center emission wavelength in nanometer.

5. The method of manufacturing a group III nitride semiconductor light emitting element of claim 4,
wherein the light emitting layer is formed such that a center emission wavelength therefrom is 280 nm or greater and 310 nm or smaller.

6. The method of manufacturing a group III nitride semiconductor light emitting element of claim 4, wherein the p-type contact layer formation step comprises:
a first step of growing a crystal of a layer made of $Al_xGa_{1-x}N$ by supplying a group III source gas, a group V source gas, and a Mg source gas; and
a second step of reducing a flow rate of the group III source gas to one fourth or less of the flow rate of the group III source gas in the first step immediately after an end of the first step, while continuing to supply the group V source gas and the Mg source gas continuously from the first step for 1 minute or longer and 20 minutes or shorter.

* * * * *